United States Patent [19]

Wilke

[11] Patent Number: 5,144,254
[45] Date of Patent: Sep. 1, 1992

[54] DUAL SYNTHESIZER INCLUDING PROGRAMMABLE COUNTERS WHICH ARE CONTROLLED BY MEANS OF CALCULATED INPUT CONTROLS

[76] Inventor: William G. Wilke, 24 Prescott St., Arlington, Mass. 02174

[21] Appl. No.: 769,108

[22] Filed: Sep. 30, 1991

[51] Int. Cl.$^5$ .......................... H03L 7/00; H03K 5/13
[52] U.S. Cl. ..................... 328/14; 307/271; 307/529; 328/155; 331/2
[58] Field of Search .................. 328/14, 155; 307/529, 307/271; 364/703, 716; 331/2

[56] References Cited

U.S. PATENT DOCUMENTS

| | | | |
|---|---|---|---|
| 4,516,084 | 5/1985 | Crowley | 331/2 |
| 4,673,891 | 6/1987 | Remy | 331/2 |
| 4,785,260 | 11/1988 | Paneth | 331/2 |
| 4,862,107 | 8/1989 | Paneth | 331/2 |

Primary Examiner—Stanley D. Miller
Assistant Examiner—Sinh Tran

[57] ABSTRACT

A frequency synthesizer comprising at least two main PLL's, where each PLL has programmable dividers in both its input path (M and P) and its feedback path (N and Q), and where the first PLL is driven by a reference source of frequency $F_{ref}$ and has output $F1 = (N/M) * F_{ref}$, and where this output serves as the input to the second main PLL, whose output in turn is $F_{out} = (Q/P) * F1 = (Q/P) * (N/M) * F_{ref}$, and each of the programmable counters is controlled by a calculation and control means, said synthesizer utilizing a method to produce an output frequency $F_{out}$ that is a close approximation to a requested frequency $F_{req}$. The method includes doing several approximations to the ratio $F_{req}/F_{ref}$, and picking the best, calculating the four integers, generating several signals, and dividing them by said integers, locking said loops, and thereby producing $F_{out}$. In one form of the invention, an approximation $X_1/Y_1$ is made to the ratio $F_{req}/F_{ref}$ and then $X_1$ and $Y_1$ are factored into $Q_1*N_1$ and $P_1*M_1$ respectively. In a preferred embodiment, an adjustable reference under control of the calculation and control means allows more than one approximation to be made, and the error for each to be determined. After a plurality of runs, each with its assigned error, one of the low error runs can be chosen, and the corresponding $M_1, N_1, P_1$ and $Q_1$ values used the program the counters. In a second form of the invention, the method uses starting values for M and N and therewith calculates approximate values for P and Q. Then, using these values for P and Q, even better approximate values for M and N are calculated, and then these four values are used to program the four counters of the two PLL's. This latter method allows severe limits to be placed on the frequency range of the intermediate PLL, thus allowing it to be a very low noise PLL.

18 Claims, 8 Drawing Sheets

| I | T | X | E | Y | F | A | B | X/Y*10 |
|---|---|---|---|---|---|---|---|---|
| 0 | 6 | 1 | 0 | 0 | 1 | 6,045,204 | 1,000,000 | |
| 1 | 22 | 6 | 1 | 1 | 0 | 45,204 | 1,000,000 | 60.000000 |
| 2 | 8 | 133 | 6 | 22 | 1 | 5512 | 45204 | 60.454545 |
| 3 | 4 | 1070 | 133 | 177 | 22 | 1108 | 5512 | 60.4519774 |
| 4 | 1 | 4413 | 1070 | 730 | 177 | 1080 | 1108 | 60.45205548 |
| 5 | 38 | 5483 | 4413 | 907 | 730 | 28 | 1080 | 60.4520397 |
| 6 | | 212767 | 5483 | 35196 | 907 | 16 | 28 | 60.452040 |

FIG. 8

DUAL SYNTHESIZER INCLUDING PROGRAMMABLE COUNTERS WHICH ARE CONTROLLED BY MEANS OF CALCULATED INPUT CONTROLS

BACKGROUND OF THE INVENTION

1. Field of the Invention

This invention relates to frequency synthesizers and more particularly to such a synthesizer which is capable of being programmed or set at a desired frequency to high resolution by means of calculated input controls.

2. Cross Reference to Related Applications

The inventors application (Rational Fraction Synthesizer submitted in Sep. 1991) is incorporated herein by reference.

3. Description of the Prior Art

The frequency synthesizer is a well known and widely used electronic subsystem. Basically, frequency synthesis involves two distinct approaches, sometimes referred to as direct synthesis and indirect synthesis. All such synthesizers utilize a source of reference frequency, such as a quartz oscillator, or atomic standard, or some other highly accurate, fixed frequency reference. The source frequency itself is operated on to provide a wide band of frequencies, each possessing the stability or accuracy of the source. In the direct synthesis approach, the designer may employ dividers, multipliers and such devices which operate on the frequency standard to derive the required output range of frequencies.

In the indirect approach, a VCO or controllable oscillator or other tunable source is used as a generator of the frequency range desired and this is then locked to the source by means of a frequency locked or phase locked loop. Thus one need not utilize complicated filtering schemes as necessary in the direct synthesis approach.

While the frequency synthesizer is characterized above as a separate test instrument, the techniques have found widespread use in the communications field as a local oscillator for a radio receiver or transmitter. A good description of some representative synthesizer techniques appear in books such as *Digital PLL Frequency Synthesizers* by Ulrich L. Rhode (1983); *Frequency Synthesizers; Theory and Design* 3rd Ed. by Vadim Manassewitsch; and *Microwave Frequency Synthesizers* by Ronald C. Sterling.

A commonly used prior art frequency synthesizer is the conventional divide-by-N phase locked loop design that generates frequencies which are multiples of a reference frequency. More specifically, such a frequency synthesizer consists of a voltage (or current) controlled oscillator (VCO), divide-by-N logic which divides the output frequency of the VCO by N to produce a signal of frequency $F_c$, and a phase (and or frequency) detector which receives the divided output at one input thereof and the reference frequency signal of frequency $F_{ref}$ at the other input thereof. The output of the phase detector is supplied back to the frequency control input of the VCO through a loop filter so that the output frequency of the VCO, after being divided by N, is equal to the frequency of the reference signal. By changing the value of N, $F_{out}$ can be changed in frequency steps equal to $F_{ref}$.

The prior art also includes the ability to divide a reference signal by M before it is input to the phase detector at a comparison frequency $F_c$. This is done because the best frequencies for building good reference clocks (e.g.: 3 to 5 MHz for crystals) are often not the best frequencies for comparison $F_c$. Thus an M divider is often used to divide down from the best $F_{ref}$ frequency to the chosen $F_c$; but it is fixed at one value—or ocassionally two—, when two different $F_c$'s are to be provided. Thus even if the prior art apparatus allowed M to be programmed, said programming was done just once, and not updated for each new requested $F_{req}$. To improve the frequency resolution of such prior art synthesizers, the designer had to decrease $F_c$, but many important characteristics such as speed of lock, noise rejection (especially microphonics), $F_c$ rejection, and so on limit the amount by which $F_c$ can be reduced. This same tradeoff exists even in the present invention, but the teaching of this invention makes the tradeoff much less strict.

Other prior art combines a single PLL and a variable timebase. This may take any of several forms. First, a single PLL may be driven by a direct digital synthesizer (DDS) subsystem used as a variable timebase, wherein the PLL becomes a "course" loop, while the DDS forms a "fine" source. The DDS is called on to "fill in the steps" between the "course" steps of the PLL. Such art has become more popular, but it still is expensive and still has inherent noise problems. Another version uses a PLL driven by a variable clock consisting of a crystal oscillator that is "pulled" by a small amount, again to effectively fill in between the "course" steps of the final loop. Though this latter technique is less expensive and does not have the noise problems of the DDS technique, it does have at least three problems of its own: First, the output is now based not on a high quality stable source, but rather on a "pulled" crystal, so overall accuracy and stability are compromised. Second, an "external timebase in" cannot be used, because the "pulled" crystal is not locked to anything. Third, an "internal timebase out" cannot be provided, because none exists; the "pulled" crystal signal is of little value to a user, because it is not constant or at a "standard" frequency. And even if a user just used it relative to the overall synthesizers output, said overall output would then fall back to only having "course" resolution relative to the (variable) timebase out.

Another characteristic of prior art variable clocks, is that they must be designed to have their step size constant, or nearly so, whereby the gaps in between the "course" steps can be filled in evenly. The "steps" of the present inventions adjustable timebase are not required to be even, as will be described below.

Synthesizers that use two PLL's and where the output of one phase locked loop is used as the reference input to another, are known in the art. Such prior art however, does not generally program all four of the division numbers, nor re-program them for each new requested frequency. Nor does this prior art have a calculation means with a calculation procedure for finding the best values for M, N, P, and Q. The present invention uses a rational fraction calculation procedure to improve resolution over this simple prior art.

Other prior art (this inventors patent application entitled "Rational Fraction Synthesizer") uses a rational fraction approximation calculation, and in one of its forms it uses a reference phase locked loop loaded with stored numbers to further enhance the ability of the calculation procedure to arrive at low error values for the second loop. The present invention improves over this prior art by synergistically combining the calculation procedure for the first loop and the calculation procedure for the second loop according to the teaching of the invention. It provides better overall resolution than would be provided by two separate prior art loops, one feeding the other but wherein their calculations were done separately.

OBJECTS AND SUMMARY OF THE INVENTION

An object of the invention is to provide a low cost synthesizer that produces a low noise, high resolution signal over a wide frequency range.

Another object of the invention is to provide a synthesizer that produces the desired output signal resolution using fewer phase-locked loop circuits than currently known techniques.

A further object of the invention is to provide a method to operate a synthesizer with two main PLL's in a way that produces much higher frequency resolution than currently known techniques.

Yet another object of the invention is to provide a synthesizer with resolution better than that of a single approximation synthesizer.

A further object of the invention is to provide a synthesizer operable with a timebase of a standard frequency, to allow the use of a "ext in" and/or a "int. out" feature.

In accordance with an aspect of the present invention, there is provided, in a frequency synthesizer comprising at least two main PLLs, where each PLL has programmable dividers (M&P) in both its input path and its feedback path (N&Q), and where the first main PLL is driven by a reference source of frequency $F_{ref}$ and has output $FI=N/M*F_{ref}$, and where this output serves as the input to the second main PLL, whose output in turn is $F_{out}=(Q/P)*FI=(Q/P)*(N/M)*F_{ref}$, where N,M,Q and P are the division values of the four programmable counters, and each of the four programmable counters is controlled by a calculation and control means, a method to produce an output frequency $F_{out}$ that is a close approximation to a requested frequency $F_{req}$, by receiving $F_{req}$, doing several calculations to arrive at integer values for N,M,Q, and P, loading them into the appropriate programmable counters, generating several signals, and dividing them by said integers, locking said loops, and thereby producing said approximate signal $F_{out}$.

In accordance with one preferred form of the present invention, $F_{req}$ is used with $F_{ref}$ and an approximation method to calculate an integer pair $X_i,Y_i$ where $X_i/Y_i \sim F_{req}/F_{ref}$, and where then both $X_i$ and $Y_i$ are factored, to give $X_i=Q_i*N_i$ and $Y_i=P_i*M_i$. These four values (or further manipulated versions thereof) are then used to program the four programmable counters in the two PLLs.

In accordance with another preferred form of the invention, $F_{req}$ is again used with $F_{ref}$ and an approximation method and several pre-selected integers, including $M_g$ and $N_g$, to calculate two integers $P_k$ and $Q_k$ which approximately satisfy $Q_k/P_k \sim (M_g*F_{req})/(N_g*F_{ref})$, where $M_g$, $N_g$ are pre-selected integer pairs, and where said pre-selected integer pairs each satisfy: $F_{imin} < (N_g/M_g)*F_{ref} < F_{imax}$, and then calculating $M_i$ and $N_i$ that, taken as a ratio $M_i/N_i$, are approximations to the ratio $(F_{req}*Q_k)/(F_{ref}*P_k)$.

Said four calculated integers are then used to program the four programmable counters. Several forms of the present invention further comprise a variable reference source, of frequency $F_{refj}$, where several values of j imply several different values of $F_{refj}$. With several $F_{refj}$ values available, several different approximations can be made, and one of the better ones (where $F_{out}-F_{req}$ is smaller than some limit) can be chosen, and the corresponding $M_i,N_i,P_i$ and $Q_i$'s used the program the counters.

The foregoing as well as other objects, features, and advantages of the present invention will be apparent from the following more particular description of the prefered embodiment of the invention, as illustrated in the accompanying drawings.

BRIEF DESCRIPTION OF THE DRAWINGS

FIG. 3 A shows a reference means consisting of a single timebase at one known frequency useful with the dual-approximation embodiment of the invention.

FIG. 3 B shows a reference means comprising a plurality of timebase means and a selector means useful in the dual-factoring embodiment of the invention.

FIG. 3 C shows a reference means comprising a timebase means, a phase-locked loop means and a memory and control means with a plurality of stored settings, useful in the dual-factoring embodiment of the invention.

DESCRIPTION OF THE PREFERRED EMBODIMENTS

Figure 2:
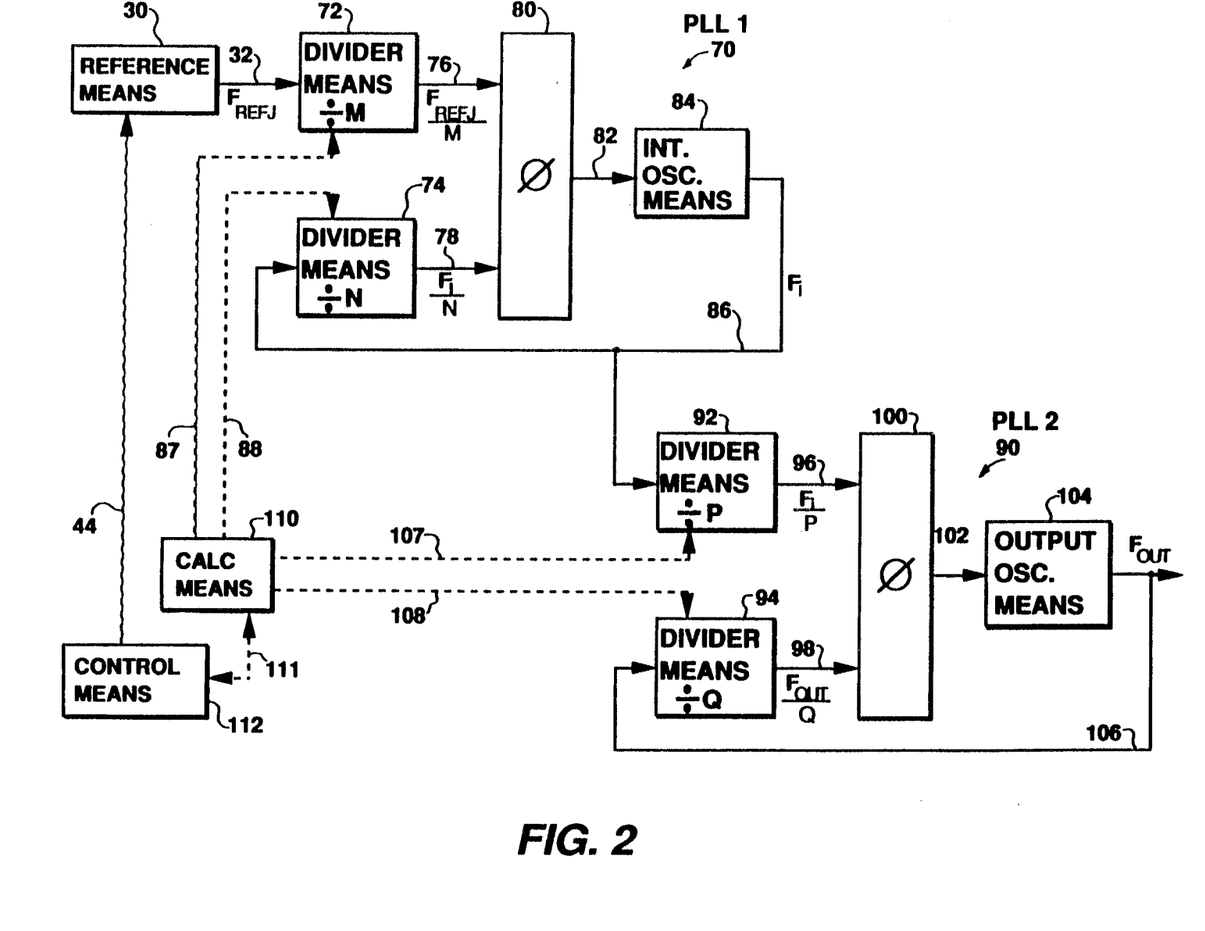
FIG. 2 is a more detailed block diagram of a synthesizer constructed in accordance with the invention.

FIG. 2 shows a detailed block diagram of the invention. As shown in FIG. 2, the output $F_{refj}$ 32 of a first oscillator means 30, with an oscillator frequency $F_{refj}$ is applied to input terminals of a 1/M programmable divider 72. Divider means 72 can be programmed by control lines 87, to divide by a range of integers, from $M_{min}$ to $M_{max}$, and, like dividers 74,92, and 94, can be any form of binary, decimal, straight, dual modulus, multi-modulus, or even analog divider, as long as it is programmable under the control of 110. Divider output 76, at a divided down frequency of $F_{refj}/M$, is applied to an input of a phase and filter means 80. Said means are known in the art, and may contain a phase detector responsive to inputs 76 and 78, and generating a signal 82 appropriate to drive controllable oscillator 84. Phase and filter means 80 may instead be a frequency detector, responsive to a frequency difference between inputs 76 and 78 or it might be a combination of phase and frequency detector; each is known in the art. Said means 80 might also include integrators, filters, and amplifiers to further condition the signal to be output at 82. Such means are known in the art in many different forms, and block 80 and block 100 (and block 58 FIG. 3C when used) are intended to represent such prior art circuitry. The control signal 82 drives intermediate oscillator means 84 which is a controlled oscillator, whose output frequency FI at 86 is responsive to the control signal at 82. Typically 84 is a voltage controlled oscillator (VCO) or sometimes a current controlled oscillator. The output 86 of oscillator 84 is at frequency FI. Said output is connected both to the input of the divider means 92 of PLL means 90, and to the input of divider means 74 of PLL 70. Buffer, amplifier, or isolator means that might be useful here, are not shown. Divider means 74 divides said input 86 by N and provides an output 78 of frequency FI/N. 78 forms a second input to phase and filter means 80, and thereby closes the loop of PLL 70. When PLL 70 is locked, the inputs 76 and 78 are constrained to be at the same frequency, and thus $F_{refj}/M = FI/N$ or $$FI = (N/M) * F_{refj} \qquad (1)$$

Output FI on line 86 also is an input for divider means 92, part of PLL 90. Therein it is divided by P, and output at 96 with frequency FI/P. Said output 96 is applied to an input of the phase and filter means 100. The output of phase and filter means 100 is control signal 102, which is input to the third oscillator means 104 and controls the frequency thereof. The output signal of 104 is on line 106 and has frequency $F_{out}$. Said line 106 serves as the final output of the synthesizer, and also as the feedback path of PLL 90 as it is applied to divider 94. After division by Q in divider 94, an output signal at 98 has frequency of $F_{out}/Q$. Said signal on 98 is applied to another input of the phase and filter means 100, and thereby the loop of PLL 90 is closed. When PLL 90 is locked, the inputs 96 and 98 are constrained to be at the same frequency, and thus $FI/P = F_{out}/Q$, or:

$$F_{out} = (Q/P) * FI \qquad (2)$$

Combining this with equation (1), one has:

$$F_{out} = (Q/P) * (N/M) * F_{refj} \qquad (3)$$

Also shown in FIG. 2 is a calculation means 110 that calculates anew, for each requested $F_{req}$, appropriate values for M,N,P, and Q. Said values are then programmed into programmable dividers 72,74,92 and 94 via data paths 87,88,107,and 108 respectively. A control means 112 can, in some embodiments, send instructions on lines 44 to change the frequency of first oscillator means 30. Said control means has stored the control values necessary to command oscillator 30 to produce any of a plurality of reference signals $F_{refj}$. Oscillator 30 will be described below. Control means 112 may be the same apparatus as calculation means 110; for example 110 and 112 may be a single microprocessor or embedded controller. In any case, there is close operative interaction between them, as indicated by line 111. The distinction intended by separating 110 and 112 schematically, is that the control 112 is limited to stored values for sending on 44 to 30 (typically under 20 pair of such values), or similarly in FIG. 3C, controlling means 64 via control 44 to provide said values, whereas calculation means 110 actually calculates the values it sends out on lines 87,88,107, and 108. The method by which calculator means 110, 112 choses $F_{refj}$ values and calculates M, N, P, and Q is described below.

Figure 3A:
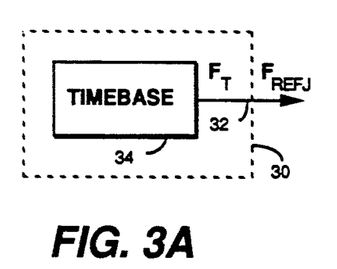

FIG. 3A shows a reference means 30 according to the second embodiment of the invention. It is a single reference timebase as known in the art. 34 might comprise a crystal oscillator, and ovenized crystal oscillator (OCXO), a temperature compensated crystal oscillator (TCXO), or some more exotic stable timebase. In the embodiment of 3-A, there is no control line 44, as there is just the single reference frequency $F_t$ available on line 32.

Figure 3B:
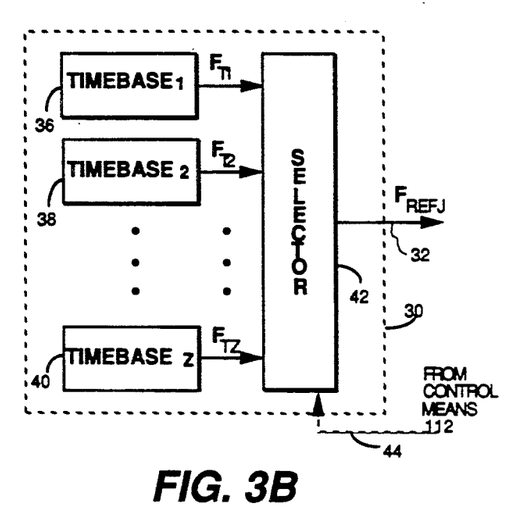
Figure 3C:
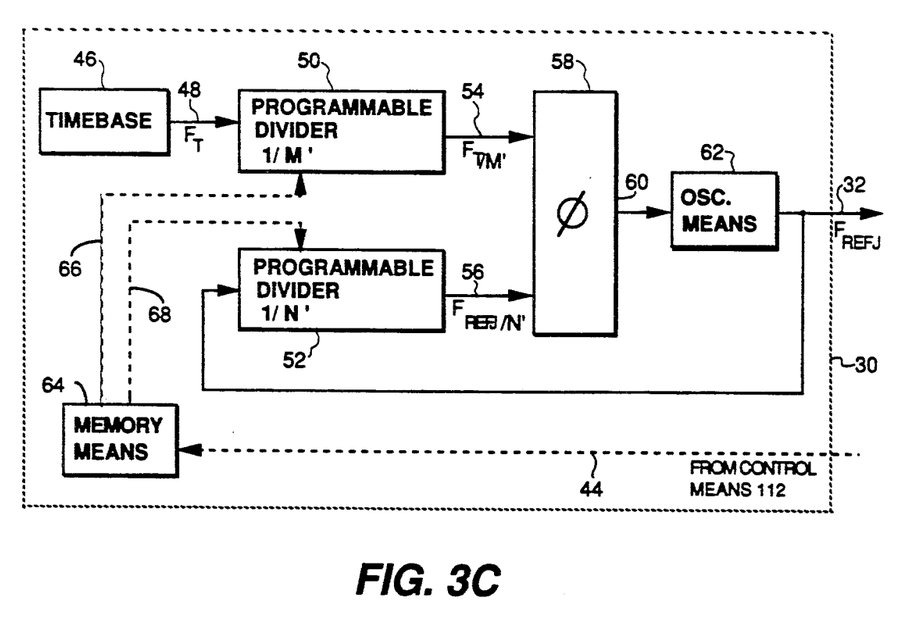

FIG. 3B and FIG. 3C show plurality reference means 30, designed to deliver, at different times, more than one reference frequency $F_{refj}$ on line 32. In FIG. 3B, said plurality reference comprises a plurality of individual timebases 36,38, . . . ,40, of number two or greater, a selector means 42 with a plurality of inputs connected respectively to the outputs of said individual timebases, and with a single output 32. Said selector is responsive to control lines 44 from control 112, and under said control, it connects the chosen timebase to output line 32. In FIG. 3B, each timebase may comprise a crystal oscillator, or a TCXO, or an OCXO etc. Each oscillates at a frequency different from all the others, and the frequency of each ($F_{ref1}$, $F_{ref2}$, . . . $F_{refz}$) is stable and known to the calculation means 110. The frequency variation between the largest and smallest $F_{refj}$ might typically be about 0.01% of $F_{refj}$, but this might change with each particular embodiment of the invention. There is no requirement that $F_{refj} - F_{refj-1}$ = constant, since according to the present invention, each new $F_{refj}$ only must provide opportunity for a new and possible better approximation to expressions containing $F_{refj}$, it is not required to evenly fill in "gaps" between "course" frequency steps as in some prior art. Also, the method of FIG. 3B does not generally allow for either an "external reference in", or an "internal reference out", though one particular $F_{refj}$ could be at a "standard" frequency and be favored in a limited way by the calculation proceedure. Its advantage is that for a small number of timebases, it could be less expensive than the scheme of FIG. 3C.

The cost of the adjustable reference shown in FIG. 3B goes up with each additional timebase that is added, and for embodiments requiring more than about three, another adjustable reference (FIG. 3C) may be preferable. In FIG. 3C, the adjustable reference signal 32 is generated by a PLL. A single timebase 46, which may be a crystal oscillator, OCXO, TCXO, exotic timebase, "external timebase in", or other, has output 48 of frequency $F_t$ connected to programmable divider means 50 wherein it is divided by $M_j'$ and output on line 54 at frequency $F_t/M_j'$. Line 54 connects to an input of the phase and filter means 58. The output of said phase and filter means is control line 60, responsive to the phase and/or frequency difference between inputs 54 and 56, and appropriate to drive oscillator 62 which may be a voltage controlled oscillator. The output 32 of said oscillator forms the output of the adjustable reference, and also connects to the input of programmable divider 52. Said dividers output is at 56, and has frequency $F_{refj}/N_j'$, and forms a second input to phase and filter means 58, and thereby closes the loop of the PLL.

When the loop is locked, the inputs 54 and 56 are constrained to be at the same frequency, and therefore the design equation for the loop is: $F_t/M_j' = F_{refj}/N_j'$ or:

$$F_{refj} = (N_j'/M_j') * F_t \qquad (4)$$

If controlled oscillator 62 is chosen to be a VCXO, then the signal out at 32 can have the excellent noise spectrum of a crystal oscillator, and in the prefered embodiment of the invention, oscillator 62 is a VCXO. Dividers 50 and 52 are programmed by control path 66 and 68 respectively from memory means 64, said memory providing $M_i', N_i'$ pairs under control 44 of means 112. Memory means 64 may indeed be the same hardware as 112 and./or 110.

Typically, timebase 46 is chosen to be at a "standard" frequency such as 1 MHz, 5 MHz, or 10 MHz, and thus the frequency $F_t$ at 48 can be made available to the user as an "internal timebase out". Similarly, an "external timebase in" can be used in place of timebase 46, and as long as said input is a simple multiple or sub-multiple thereof, could be used by merely altering all the stored values of M' or N' so that the values of $F_{refj}$ 32 are unaffected.

Other possible oscillators known in the art could serve as adjustable reference in the present invention, though I have not shown them explicitly. An example might be a free running VCXO driven by a D/A controlled by means 112 and calibrated such that means 112 "knows" the value of $F_{refj}$ that will result from various values sent to the D/A. Any such schemes must be able to provide and know the $F_{refj}$ values to an accuracy greater than the accuracy expected for the final $F_{out}$, since the further calculations to produce $F_{out}$ are directly proportional to the value of $F_{refj}$. So, though any timebase that produces a plurality of $F_{refj}$'s that are controllable by 112 and "known" to the calculation means 110 is deemed covered by the invention, the preferred version is often that shown in FIG. 3-C.

All of the PLL components heretofore mentioned, are known in the art. Also known in the art, is that additional components such as buffers amplifiers, filters, splitters etc are often necessary for the optimal operation of said loops. These components have not been specifically described here because they are not the subject of the present invention, but they are assumend to be part of the loops where required. In addition, much prior art concerns itself with improving the electrical operation of PLL's, such as improving their speed of lock, decreasing their spurious noise, reducing their $F_C$ feedthrough, and so on. The present invention is independent of most of this art, but such art can still in many cases be profitably included in the PLL design when designing a synthesizer according to the teaching of this present invention.

OPERATION

The form of the PLLs is conventional as described above. The novel aspect of the present invention arrises in programming all four dividers in the two PLLs, and in their combination with a calculation proceedure to generate the four divisors and to control, in some embodiments, the reference source of the synthesizer.

Figure 1A:
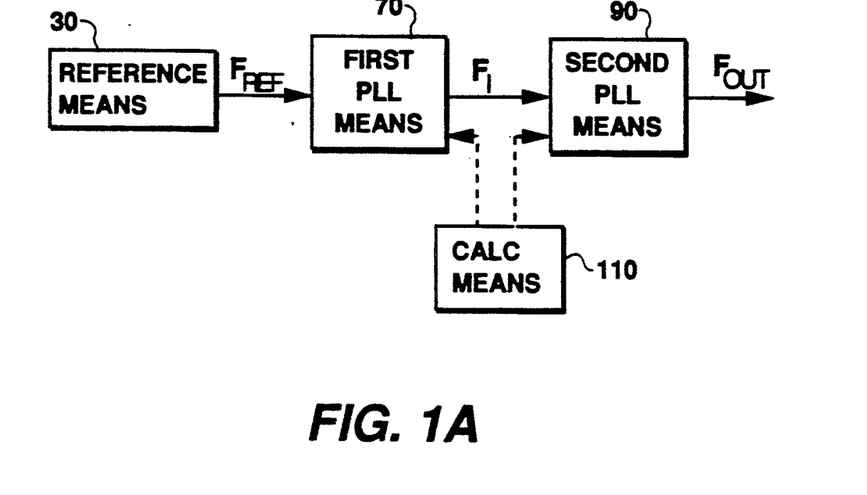
FIG. 1A is a schematic block diagram of a synthesizer constructed in accordance with a dual-approximation form of the invention.
Figure 1B:
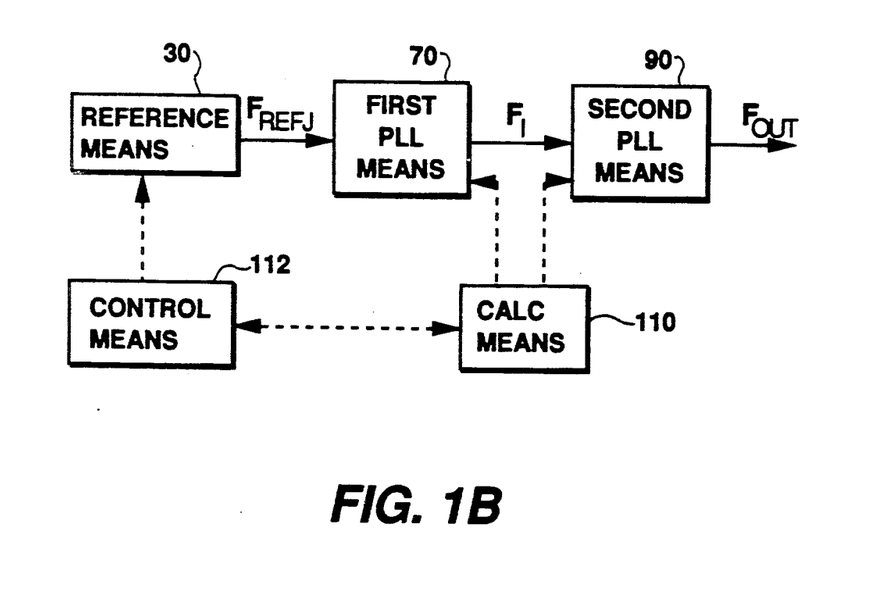
FIG. 1B is a schematic block diagram of a synthesizer constructed in accordance with a dual-factoring form of the invention.

There are two versions of the calculation proceedure, hereinafter called "dual-factor" and "dual-approximation". The hardware means previously described is similar for the two versions, and could be identical, but in their prefered embodiments the reference means is different, as shall be described below, and as is indicated schematically in FIG. 1A and FIG. 1B. Equation (3), the design equation for the present invention, can be combined with the equation describing the approximation ($F_{out} \sim F_{req}$) to give:

$$F_{req}/F_{refj} \sim F_{out}/F_{refj} = X_i/Y_i = (Q*N)/(P*M) \qquad (5)$$

Upon receiving a requested value of $F_{req}$ (from hardware not shown), the calculation means 110 of both versions of the invention, makes a plurality of rational fraction approximations $(X_i/Y_i)$ to the known value $F_{req}/F_{refj}$. Each succeeding cycle of the approximation proceedure provides a better approximation, as the sizes of $X_i$ and $Y_i$ get progressively larger. Both versions try to calculate values of $X_i$ and $Y_i$ that are simultaneously good approximations of $F_{req}/F_{refj}$, are themselves in the form of products: $X_i = Q_i * N_i$, and $Y_i = P_i * M_i$, and wherein $Q_i$, $N_i$, $P_i$, and $M_i$ are integers that are respectively within the programming ranges of programmable dividers 94, 74, 92, and 72. "Acceptable" hereinafter shall refer to values for $Q_i$ such that $Q_i < Q_{max}$, $P_i$ such that $P_i < P_{max}$, and so on.

DUAL-FACTOR EMBODIMENT

Figure 4:
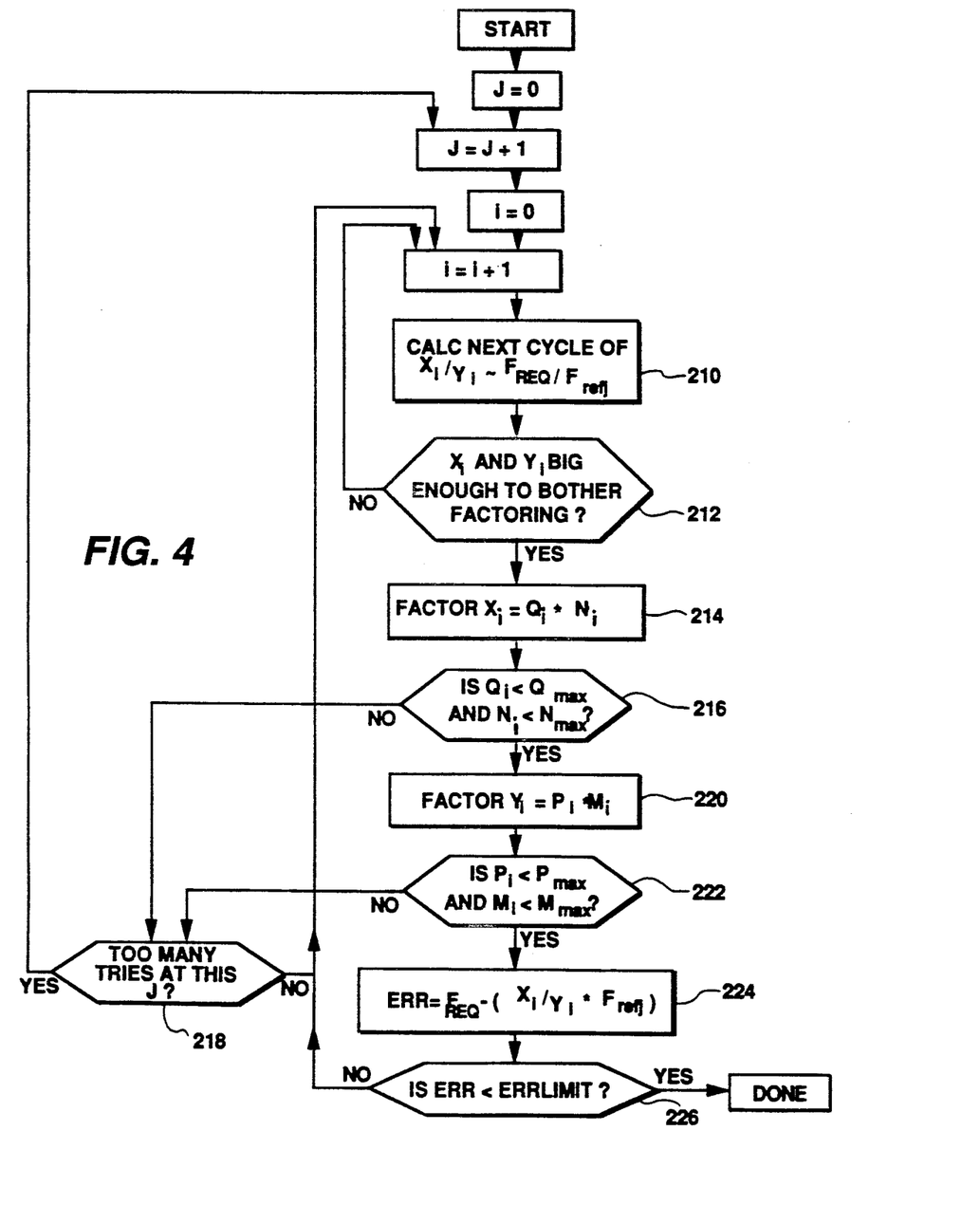
FIG. 4 is a flow chart description of the calculation proceedure for the preferred form of the dual-factoring embodiment of the invention.

The operation of the dual-factor embodiment is shown in a simplified flow chart in FIG. 4. In simplest terms, this embodiment will begin approximating $F_{req}/F_{refj}$ by $X_i/Y_i$. With each new cycle of the approximation (each new i), the invention will factor $X_i$ and $Y_i$ and if said factors $Q_i * P_i = X_i$ and $P_i * M_i = Y_i$ are "acceptable", and the size of the approximation error is less than some maximum, then the calculation concludes and $Q_i, N_i, P_i$, and $M_i$ can be programmed into dividers 94, 74, 92 and 72 respectively. However, should the error be greater than errlimit, then i is incremented and the next cycle begun. Should an entire aproximation sequence fail, then either the best failing approximation would be used, or, in the prefered embodiment, using the plurality reference of FIG. 3B or FIG. 3C, a new $F_{refj}$ would be requested and the approximation sequence begun again.

In more detail, and in a prefered embodiment of the dual-factor version, calculation means 110 receives a request for a new $F_{req}$ from hardware not shown. The calculation process then initializes j and i to their starting values. j is used with the adjustable reference, and refers to the $j^{th}$ clock frequency. In FIG. 3B, this is the frequency of timebase j, selected and available on line 32 as $F_{refj}$. In FIG. 3C it would be again the frequency on line 32, when dividers 50 and 52 have been programmed with values $M_j'$ and $N_j'$ respectively and $F_{refj} = (N_j'/M_j') * F_t$. i refers to the $i^{th}$ cycle of the approximation process detailed further in FIG. 7 and FIG. 8. After initialization, i is incremented and the first approximation $X_i/Y_i \sim F_{req}/F_{refj}$ is calculated. The next step is to factor $X_i$ and $Y_i$, but the first few values of $X_i$ and $Y_i$ typically will be such poor approximations that it is quite unlikely that $$err = F_{req} - F_{out} = F_{req} - \{(X_i/Y_i) * F_{refj}\} \qquad (6)$$

will be less than "errlimit", and as a time saver the process may skip the factoring of the first few values of $X_i$ and $Y_i$. This step is not integral to the invention, and whether or not it is included depends on factors such as speed of factoring, available memory, overall speed requirements and so on. After i is large enough to make it worthwhile to begin factoring, the process reaches block 214, wherein $X_i$ is factored. There, a factoring means, typically part of calculation means 110, calculates $X_i = Q_i * N_i$. If $X_i$ is prime, then the factor means sets $Q_i = 1$ and $N_i = X_i$ (or equivalently $N_i = 1$ and $Q_i = X_i$). Such factor means are known in the art of number theory and may include any of several calculation proceedures or other proceedures. Such means would typically be chosen according to a speed criterion, though a cost criterion might also be important. After $Q_i$ and $N_i$ have been calculated, they are tested to see if they are "acceptable".

If either test fails because $Q_i$ or $N_i$ was too large, the process moves to block 218. Here the process determines whether there have been too many cycles at this value of j; in other words whether i should continue to be incremented for another cycle of the approximation or alternatively whether all subsequent i's will fail and a new sequence should begin with a new value of j and with i starting over at its initial value. The most direct version of this test would be a test for $X_i > X_{max}$ or $Y_i > Y_{max}$, where $X_{max} = Q_{max} * N_{max}$ and $Y_{max} = P_{max} * M_{max}$. If either $X_i > X_{max}$ or $Y_i > Y_{max}$, then there will never be additional "acceptable" values generated by incrementing i, because the integers $X_i$ and $Y_i$ calculated by block 210 always increase in size for each increment in i. This test is not the same as the test in block 216 however, because it may well happen that $Q_i > Q_{max}$ but $Q_{i+1} < Q_{max}$ depending on how $X_i$ happens to factor. If test 218 fails, then a new j is chosen and the control means 112 is instructed to change the hardware of first oscillator 30 to produce a new reference frequency $f_{refj+1}$, i is re-initialized and a new approximation sequence is begun. If test 218 is passed ($X_i$ not greater than $X_{max}$ etc) then i is incremented and another cycle of approximation is carried out by process step 210. If at block 216 both $Q_i$ and $N_i$ are "acceptable", then the process will factor $Y_i$ at step 220. The proceedures of block 220 and 222 are similar for $Y_i = P_i * M_i$ to blocks 214 and 216 are for $X_i = Q_i * N_i$. If the tests of block 222 indicate that $P_i$ and $M_i$ are "acceptable", then block 224 and 226 tests to see if the overall error limit of the $i^{th}$ approximation of reference clock j is acceptable. If not, i is incremented for a new cycle of the approximation. If so, then the heart of the calculation is ended, with the resulting $F_{refj}$, and "acceptable" values of $Q_i, N_i, P_i$ and $M_i$.

It must be noted that many other embodiments of this calculation proceedure are possible as part of the present invention. Obvious examples would be to swap blocks 214,216 with blocks 220,222. Similarly, block 212 could be deleted. Similarly, tests 224,226 could be done between blocks 210 and 214, or a long sequence of $X_i, Y_i$ values could be calculated before any of the factoring "acceptability" tests are done. All such choices of sequence will depend on the capabilities of the particular calculation means 110 and the criteria to be optimized. Said criteria typically put speed of calculation first, but could just as well be optimized for hardware costs etc.

OPERATION OF THE DUAL-APPROXIMATION EMBODIMENT

The second version of the present invention is called a dual-approximation version. This embodiment also uses the hardware means as shown in FIG. 1, FIG. 2, and FIG. 3. The only hardware differences are that the prefered embodiment of said dual-approximation version uses the lower cost single timebase of FIG. 3A or at most a two timebase version of FIG. 3B. Also in this second preferred version, the calculation proceedure can handle the situation where the first PLL means 70 has a very limited range for its output frequency FI on 86. The virtues and tradeoffs of this version compared to the dual-factor version, will be discussed in the conclusion of this section.

Figure 5:
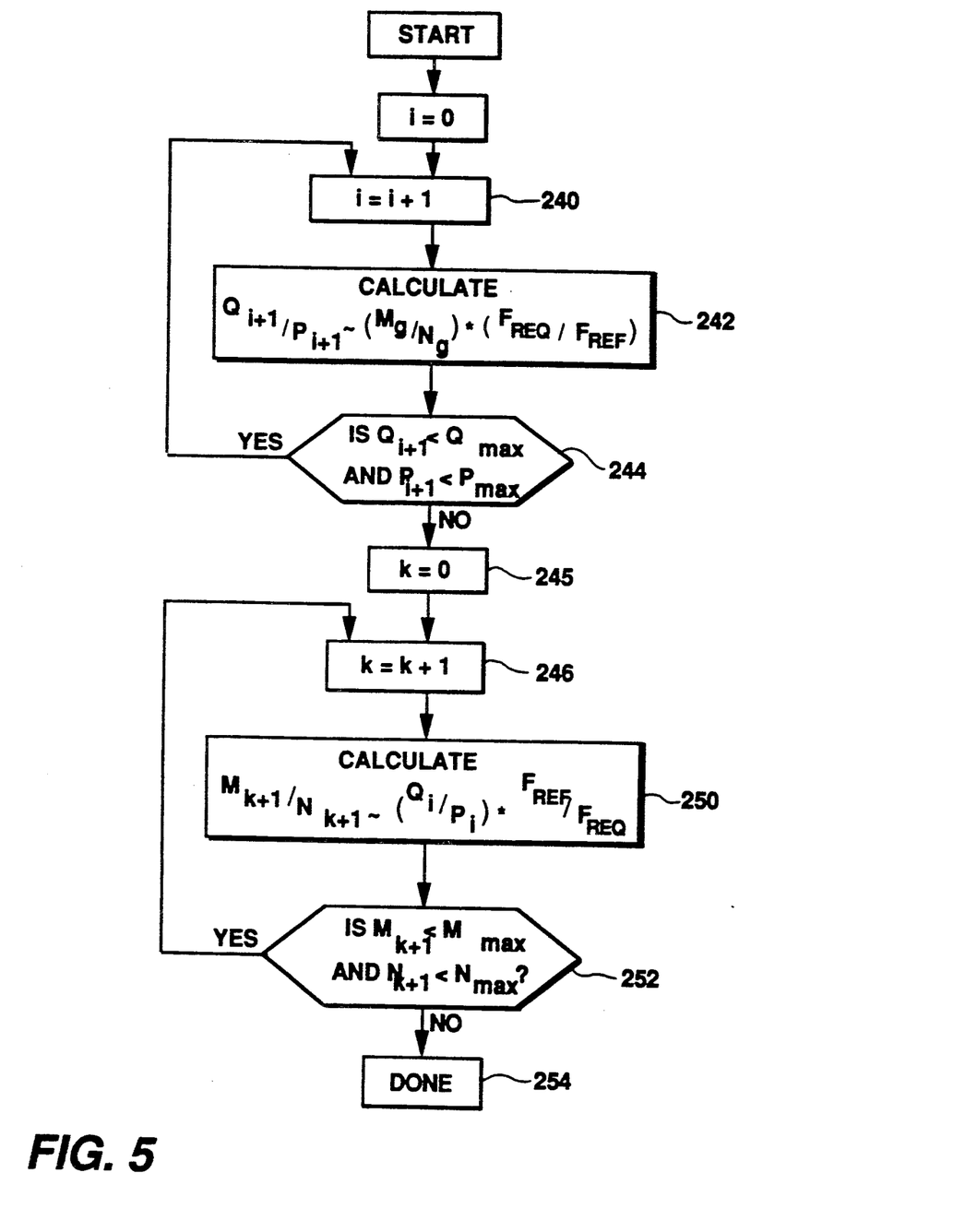
FIG. 5 is a flow chart description of the calculation proceedure for the dual-approximation embodiment of the invention.

FIG. 5 shows a block diagram of the calculation proceedure according to said second version of the invention. In this version, as in all forms of the present invention, the design equation for the synthesizer, is still equation (3):

$$F_{out} = (Q_i/P_i) * (N_i/M_i) * F_{refj}. \tag{3}$$

Here typically there is just a single clock, so j is not needed, and $F_{refj} = F_{ref}$. Additionally, we can restrict FI to very only over a small range, so that oscillation means 84 can be a VCXO means, with its limited frequency range, but with its excellent noise spectrum. Since equation (1) $FI = (N/M) * F_{ref}$ then for $FI \sim$ constant $+ -$ small delta, we must be able to handle $N_i/M_i \sim$ constant $+ -$ delta'. At the time of design, when $F_{ref}$ is chosen and delta is chosen, at least one pair of integers $N_g$ and $M_g$ can be calculated that are both "acceptable" and which satisfy $FI_g = (N_g/M_g) * F_{ref}$ such that $FI_g$ is somewhere within the allowed range of FI or: $FI_{min} < (N_g/M_g) * F_{ref} < FI_{max}$. These will be used as "guess" values or starting values of $N_i$ and $M_i$. The design equation (3), using these values, is: $F_{out} = (Q_i/P_i) * (N_g/M_g) * F_{ref}$ which can be rearranged with $F_{out} \sim F_{req}$ to become:

$$(Q_i/P_i) \sim (M_g/N_g) * (F_{req}/F_{ref}), \tag{7}$$

where all the values on the right are known.

After initialization of i and the calculation of $(M_g * F_{req})/(N_g * F_{ref})$, block 242 begins the approximation process to find values of $Q_i$ and $P_i$ that are succesively better approximations to equation (7). In block 244, each $Q_i$ and $P_i$ is tested to see if it is still "acceptable". Steps 240, 242 and 244 are cycled, with $Q_i$ and $P_i$ growing in size and with the approximation improving, until $Q_i$ or $P_i$ has grown large enough to fail the "acceptability" test of block 244. If the $i+1^{th}$ value of $Q_i$ or $P_i$ is the first to fail, then the $i^{th}$ values are the largest "acceptable" pair of values. Said values $Q_i$ and $P_i$ are substituted into the design equation (3) to get: $F_{out} = (Q_i/P_i) * (N_k/M_k) * F_{ref}$, which can be rearranged to become:

$$M_k/N_k \sim (Q_i/P_i) * (F_{ref}/F_{req}), \tag{8}$$

where again all values on the right side of the equation are completely known. After initialization of k in block 245, a second sequence of approximations begins, this time calculating, in block 250, the best values of $M_k$ and $N_k$ that are sucessively better approximations of equation (8). In block 252, each $M_k$ and $N_k$ is tested to see if it is "accectable". Steps 246,250 and 252 are cycled with $M_k$ and $N_k$ growing in size and with the approximation improving, until $M_{k+1}$ or $N_{k+1}$ has grown large enough to fail the "acceptability" test of block 252. If the $k+1^{th}$ value of $M_k$ or $N_k$ is the first to fail, then the $k^{th}$ value is the largest "acceptable" pair of values. Said values $M_k$ and $N_k$ are also substituted into the design equation (3) to get:

$$F_{out} = (Q_i/P_i)*(N_k/M_k)*F_{ref},$$

wherein all four integers $Q_i$, $P_i$ etc are "acceptable" to be loaded into dividers 94, 92, 74, and 72 respectively.

Said integers may also be required to pass other size tests, that have a bearing on noise, time to lock, $F_{ref}$ feedthrough and so on; such tradeoffs are known to those skilled in the art. The $M_k$ and $N_k$ values finally selected by the calculation process of FIG. 5 may occasionally end up being the exact ones first "guessed" at, i.e.: $M_g$ and $N_g$. But they may also be other values that give an even better final approximation to the requested frequency.

Figure 6:
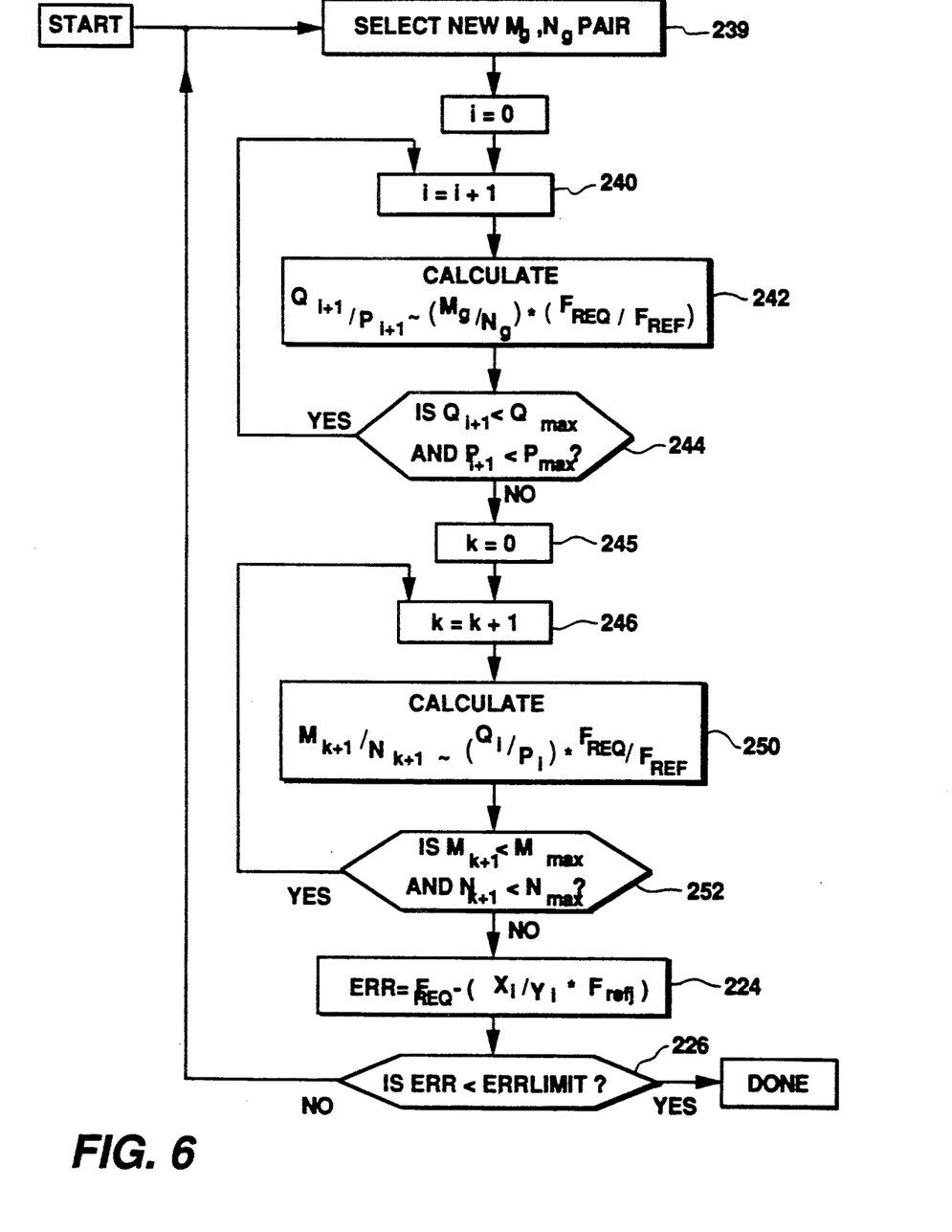
FIG. 6 is a flow chart description of the calculation proceedure for the dual-approximation embodiment of the invention, with further capability to use more than one pair of starting values $M_g$, $N_g$.

Also included in the present invention, and shown in the flow chart of FIG. 6 is the method of trying more than one pair of "guess" values, where they will lead to different $Q_i$, $P_i$ values, and then picking the resulting integers that give the best approximation, perhaps where $err = F_{req} - F_{out}$ is a minimum, or alternatively choosing the first error to be less than an error limit value. As a practical point, for the multi-guess method to be helpful, the range of $Fi_{max}$ to $Fi_{min}$ often must be wider than in the single guess dual-approximation method, and sometimes the size of $P_{max}$ and $Q_{max}$ must be larger, such that the several $N_g, M_g$ values actually result in New $P_i, Q_i$ values. This third embodiment also can use to advantage the adjustable reference oscillator (30) configurations described above, though in many applications the error resulting from the dual approximation proceedure described above, is small enough that the expense etc. of the multiple configurations is not required, and just the single $F_{ref1}$ (as in FIG. 3A) is sufficient.

There are several advantages of each embodiment of the invention. As is known in the art of number theory, the error of an approximation according to the process of blocks 210, 242, and 250 is:

$$err_i < 1/Y_i^2. \quad (9)$$

According to the teaching of the dual-factor embodiment of the present invention, $Y_i$ is in the form of a product $Y_i = P_i * M_i$. While $P_i$ and $M_i$ have limits on their size ($P_{max}$ and $M_{max}$), the corresponding limit on $Y_i$ is the product of $P_{max}$ and $M_{max}$ (though depending on the factoring, $Y_i$ may not reach $P_{max}*M_{max}$, because the limits are really on $P_i$ and $M_i$ *individually, not on $Y_i$*). Thus the error maximum of this embodiment is better by a factor of as much as $*M^2_{max}$, over this inventors prior art containing just one calculated PLL.

This dual approximation embodiment also has several strong virtues. It does not require that calculation means 110 be able to factor integers, nor will it have to repeat itself numerous times because either $X_i$ or $Y_i$ was prime and therefore unfactorable or because one factor was so small that the overall size of $X_i$ or $Y_i$ was limited in size and hence the error was larger than desired. Also, by starting with a prestored "guess" at the value of $M_i$ and $N_i$, a very beneficial restriction is placed on the final ratio of $N_i/M_i$ (though not the size of $M_i$ or $N_i$ individually)—it will be close to the same ration as the "guessed" $N_i$ and $M_i$. This in turn means that the frequency FI (86) of the oscillator means 84 of the first PLL means 70 is always within a small frequency band about a constant value, and this in turn means that it is often quite feasible that oscillator means 84 be a VCXO or similar very small range variable, with their very good noise characteristics. Also, if oscillator 84 is a VCXO with its good noise characteristics, then there is less of a penalty for allowing $N_{max}$ and $M_{max}$ to be large—or at least a lot larger than $P_{max}$ and $Q_{max}$. This allows the second and "final" approximation of equation (8) to have bigger ratio values ($M_i$ and $N_i$) and therefore typically to be a much better approximation than the first approximation in Equation (7), since $error < 1/N_i^2$).

Figure 7:
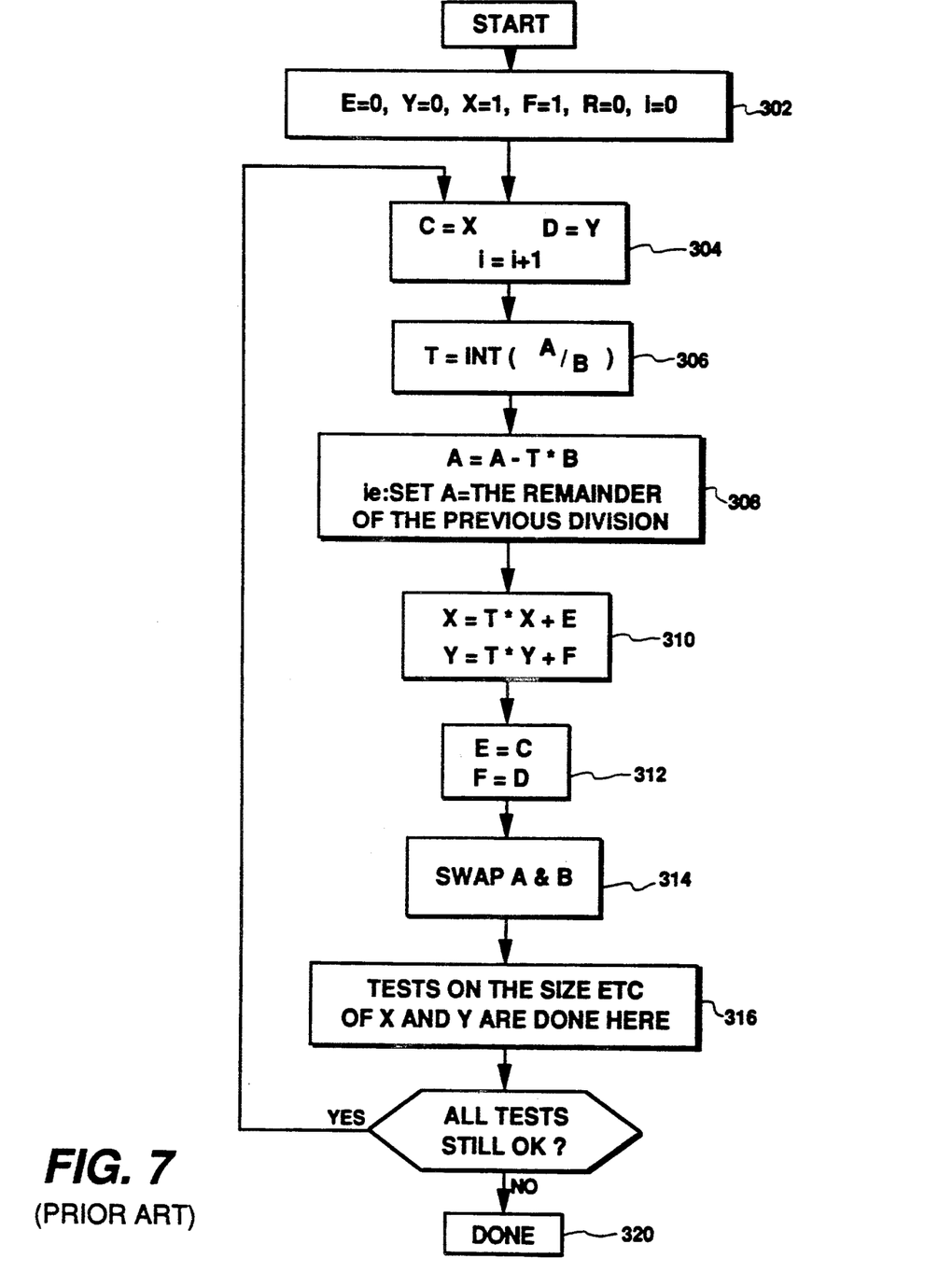
FIG. 7 is a detailed flow chart description of a prior art rational fraction calculation proceedure of Block 210 of FIG. 4, and Blocks 242 and 250 of FIG. 5, and FIG. 6.
Figure 8:
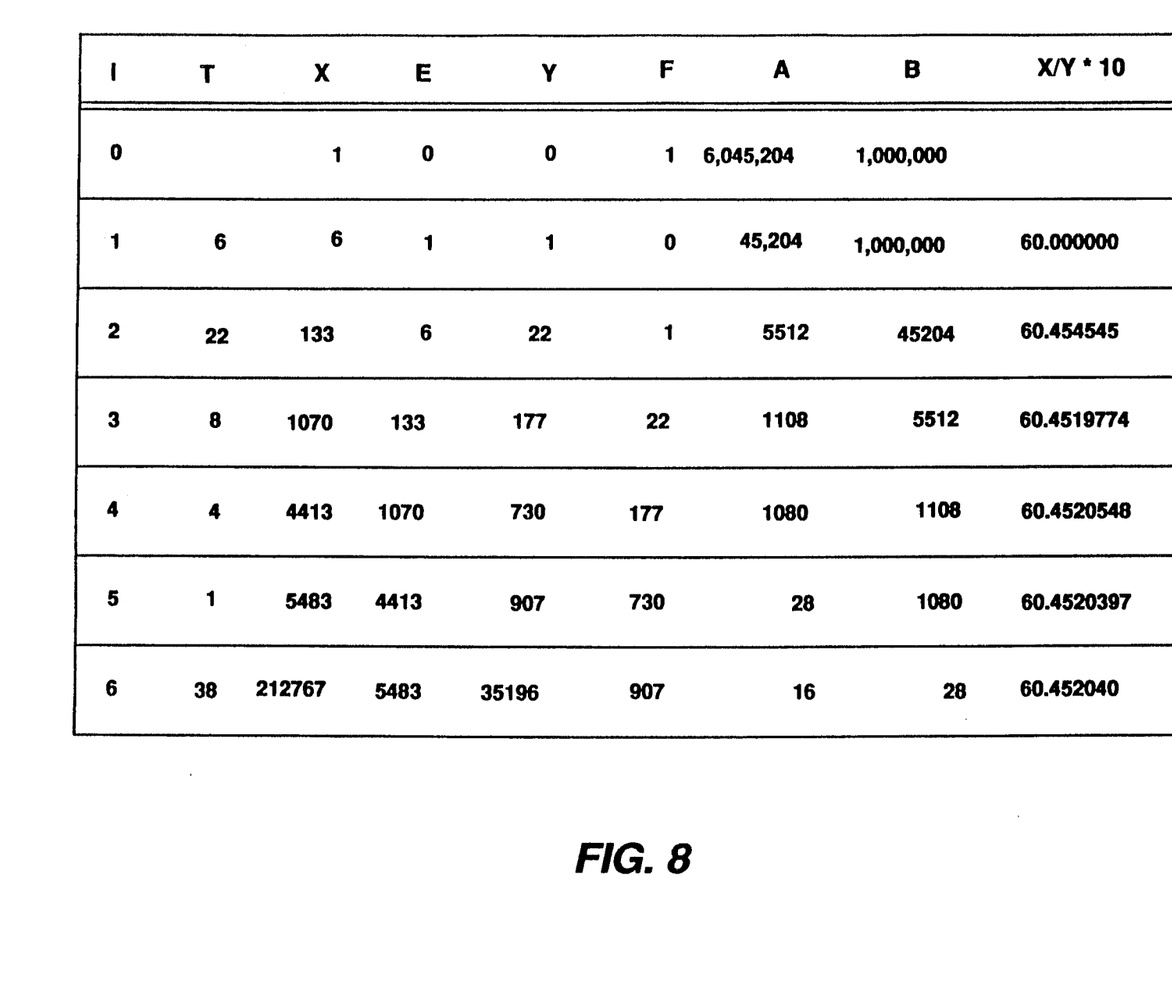
FIG. 8 is a table illustrating a sample calculation according to the prior art proceedure of FIG. 7.

A typical Euclid approximation is shown by way of example in FIG. 7 and FIG. 8 and described in detail in this inventors application (Rational Fraction Synthesizer)

It is often also of value, as claimed in said application, for Oscillator 84 to have its center frequency "off" of being a multiple or submultiple of reference means (30) by and amount equal to about $1/P_i$ or more, because again, this allows the approximation proceedure to turn out $M_i$ and $N_i$ values that start reasonably "small"(under 1000 or 2000 or so).

The $M_i$, $N_i$, $P_i$, and $Q_i$ values calculated by the calculation means 110 of either form of the invention, can vary considerably in size. For example, if $M_{max} = 1000$ and $N_{max} = 3000$, one might get (in response to requests for various $F_{out}$ values) $M_i, N_i = 937, 1293$; 17,27; 806,3192; 391,823 etc. The only guarantee is that the legal $M_i$'s will be less than $M_{max}$ and $N_i$'s will be less than $N_{max}$. These values of $M_i$ and $N_i$ will work if loaded into the appropriate programmable divider. It is known, however, to those skilled in the art of PLL's, that many important characteristics of a PLL (such as stability, time of lock, gain, noise, etc.) are influenced by the size of $N_i (\& M_i)$. Thus in addition to the calculations described in FIG. 4 and FIG. 5, it may be necessary to "scale up" the original $M_i$ and $N_i$ values by multiplying each by the same constant s. s is set equal to the lesser of $\text{int}(N_{max}/N_i)$ and $\text{int}(M_{max}/M_i)$, so that when $s*N_i$ is loaded into divider 74, and $s*M_i$ is loaded into divider 72, we can be assured that each is still "acceptable", is: $s*N_i < N_{max}$ and $s*M_i < M_{max}$. When the scaled up values of M and N (and similarly for P and Q) are used in the dividers, the value of $F_{out}$ is unchanged, because:

$$F_{out} = ((Q_i*v)/(P_i*v)*(N_i*s)/(M_i*s))*F_{ref1}$$
$$= (Q_i/P_i)*(N_i/M_i)*F_{ref1}$$

Even with the above scheme, one might get variations in the size of say $N_i * s$ as large as a factor of two. In the highest performance versions of the first PLL (70), it might be considered necessary to modify the amplifier or filter or both of means 80 to further compensate for this remaining size variation in $N_i*s$. Such active alterations to the amplifiers, integrators and or filters of a PLL are not widely used (due to cost and complexity reasons), but they have been described in the prior art, and could be useful in combination with the present invention. Similar scaling for $P_i$ and $Q_i$ may be beneficial, as well as similar control of the characteristics of means 100.

There might be situations where all of the calculations for a plurality of $F_{out}$'s would be done before they are needed, and the results ($N_i, P_i$ etc) stored in memory. Then when a new $F_{out}$ was required (among the limited set that was precalculated) these number sets would need merely to be latched into the programmable counters. The number of such pre-computed integers could be fairly large, but would be limited by memory size, and would always be tiny when compared to the billions of other frequency combinations the invention could produce. They could nonetheless, be useful in situations like: 1) "frequency hopping" and 2) a "stored setup" feature in a benchtop synthesiser, and are to be considered as part of the teaching of the present invention.

There has thus been shown and described a novel frequency generator which fulfills all the objects and advantages sought therefor. Many changes, modifications, variations and other uses and applications of the subject invention will, however, become apparent to those skilled in the art after considering this specification and the accompanying drawings which disclose the prefered embodiment thereof. All such changes, modifications, variations and other uses and applications which do not depart from the spirit and scope of the invention are deemed to be covered by the invention which is limited only by the claims which follow.

GLOSSARY

I have tried to use standard definitions for all of my text, but I do use a few terms with a more specific meaning-mostly to be able to use a phrase over and over, instead of having to use a whole paragraph over and over. These include:

"ACCEPTABLE" VALUES: are divider values M, N etc which are smaller than some pre-defined limit values $M_{max}$, $N_{max}$, etc. The limit values are at most the size of their respective programmable counters (which have some maximum division capability), but they could also be much smaller, depending on other constraints such as various PLL dynamic characteristics that are to be optimized, such as noise, reference feedthrough, time of lock, etc.

COMPARISON MEANS: is essentially the phase detector, integrator and filter. It also would include a frequency detector or (as is most common) a hybred of the two. I've also lumped in here (for the sake of brevity) the integrators, filters, etc, necessary to condition the control signal before it is shipped to the controllable oscillator.

DESIGN EQUATION: here is used to name the equation which relates the four PLL variables $F_{in}$, T, U, $F_{out}$; where $F_{in}$ is the frequency of the signal coming into the PLL (often $F_{in}=F_{ref}$). T is the division value for the divider receiving $F_{in}$, $F_{out}$ is the output frequency of the VCO of the PLL, and U is the division value for the feedback divider which divides $F_{out}$. The output therefore of the first divider is $F_{out}/T$, and the output of the feedback divider is $F_{out}/U$, and since these signals are fed to the phase detector and the PLL action in lock forces them to be equal, we have $F_{in}/T = F_{out}/U$, or equivalently $F_{out}=(U/T)*F_{in}$, which is what I call design equation.

EUCLID'S ALGORITHM: possibly the oldest known algorithm (prior art with a vengence!). It has many uses in various forms, including finding GCD's and LCD's, but as here, it can be used to produce rational fraction approximations to a given ratio. Note that there are several modern version of this aloritnm, that are optimized for various kinds of processor or size of input number EXT. IN/INT. OUT: stands for "external timebase input" and "internal timebase output". These are signal inputs and outputs that show up in many synthesizer products. They are quite useful in allowing respectively: the use of a higher stability external timebase whose stability, drift, etc is even better than the $F_t$ timebase included with the standalone synthesizer, and the use of an "int. out" signal to synchronize an external device (for example, a counter-timer) to the synthesizers internal timebase. Both these signals and the hardware to switch them in and out and support the feature is very old prior art.

LOCK: When a PLL is locked, I mean: its inputs and outputs are defined by the design equation. Though much prior art (and any number of patents) concern themselves with the details of optimally going from an unlocked state to a locked state, and further, how to optimize the locked state itself, such is not the subject matter of the present invention.

PLL: phase locked loop. Though a PLL can contain as little as a controllable oscillator and a comparison means with no dividers, when I use the term PLL here to refer to a PLL with a reference input, a first prorammable divider that divides the reference input, a comparison means with one of its inputs connected to the output of the first divider, a controllable oscillator, a second programmable divider whose input is connected to said oscillator, and whose divided output is connected to the other input of the comparison means, so that the comparison means can provide a correction signal to the controllable oscillator of a strength and polarity to bring the loop into lock. I also include in this term frequency locked loops, hybred phase/freq. locked loops, etc.

int(A) is a math expression meaning "integer value of A", so int(7.41)=7 and int(3/2)=1, etc.

PROGRAMMABLE DIVIDER: this is any divider that will divide by a range of integers, and where the division is controllable by the external control and calculation means. It includes binary, decimal, dual and multi-modulus counters, counters within ASIC's etc.

STANDARD FREQUENCY: usually 1, 5 or 10 MHz—these are the standard frequencies that a typical synthesizer would expect to use as an external reference or to provide as an "int. out" in the 60's, 1 MHz was more popular, but for a long time now 10 MHz has been the most common.

VCXO: Voltage controlled crystal oscillator. This is a controlled oscillator, based on a crystal as the resonant element. It can be used as the controllable oscillator in a PLL. Its characteristics include a very good noise spectrum (almost, but not quite, as quiet as a plain crystal oscillator), but only a very narrow frequency range of oscillation (~50 to perhaps 300 ppM, depending on how badly noise levels are to be impacted).

I claim:

1. In a frequency synthesizer of a type employing an adjustable reference means, and a first PLL of known type locked thereto, and a second PLL of known type locked to the output of said first PLL, and a calculation and control means operatively connected to said first and second PLL's, a method for generating an output signal $F_{out}$ from said second PLL, having a low noise, adjustable frequency, which is a close approximation to a requested frequency $F_{req}$, said method comprising the steps of:

(a) receiving a request for an output frequency $F_{req}$;

(b) selecting a value $F_{refj}$ within the frequency range of said adjustable reference means;

(c) calculating a plurality of integer pairs $X_i, Y_i$ that, taken as a ratio $X_i/Y_i$, are approximations to the ratio $F_{req}/F_{refj}$;

(d) factoring said $X_i$ into two integer factors $Q_i$ and $N_i$, whereby $X_i=Q_i*N_i$, (e) factoring said $Y_i$ into two integer factors $P_i$ and $M_i$, whereby $Y_i = P_i * M_i$;

(f) selecting a pair $X_k, Y_k$, from among said plurality of pairs, with the largest value of $Y_k$ and wherein each of said integer factors $Q_k, N_k, P_k$ and $M_k$ is respectively less than pre-specified maximum values $Q_{max}, N_{max}, P_{max}$, and $M_{max}$;

(g) calculating a value, responsive to the equation:
$err = F_{req} - F_{out} = F_{req} - (N_k/M_k)*(Q_k/P_k)*F_{refj}$;

(h) comparing said calculated value to a pre-selected limit value, and upon the condition that said calculated value is larger than said limit value, selecting a new value of $F_{refj}$, and repeating steps (b) through (h); and upon the condition that said calculated value is smaller than said limit value, proceeding to step (i);

(i) adjusting said adjustable reference means to generate a reference signal of frequency $F_{refj}$, wherein $F_{refj}$ is the reference frequency value in use when step (h) was satisfied;

(j) generating an intermediate signal FI in an intermediate oscillator in said first PLL, said intermediate oscillator responsive to a first control signal;

(k) sending said integer $M_k$ to a first programmable divider responsive to said reference signal $F_{refj}$, wherewith to program its divide value, and sending said integer $N_k$ to a second programmable divider responsive to said intermediate signal FI wherewith to program its divide value;

(l) dividing said reference signal $F_{refj}$ by said integer $M_k$ in said first programmable divider, to produce a divided signal ($F_{refj}/M_k$), and dividing said intermediate signal FI by said second integer $N_k$ in said second programmable divider, to produce a second divided signal (FI/$N_k$);

(m) comparing said two divided signals in a first comparison means, to produce said first control signal that is responsive to the difference between $F_{refj}/M_k$ and FI/$N_k$;

(n) controlling said intermediate oscillator by means of said first control signal to cause said first PLL to lock, and whereby $FI = N_k/M_k * F_{refj}$;

(o) generating an output frequency signal ($F_{out}$) in an output oscillator in said second PLL, said output oscillator responsive to a second control signal;

(p) sending said integer $P_k$ to a third programmable divider responsive to said intermediate signal FI, wherewith to program its divide value, and sending said integer $Q_k$ to a fourth programmable divider responsive to said output signal $F_{out}$, wherewith to program its divide value;

(q) dividing said intermediate signal FI by said integer $P_k$ in said third programmable divider, to produce a divided signal (FI/$P_k$), and dividing said output signal $F_{out}$ by said integer $Q_k$ in said fourth programmable divider, to produce a second divided signal ($F_{out}/Q_k$);

(r) comparing said two divided signals in a second comparison means, to produce a second control signal that is responsive to the difference between FI/$P_k$ and $F_{out}/Q_k$;

(s) controlling said output oscillator by means of said second control signal to cause said second PLL to lock, and whereby $F_{out} = Q_k/P_k * FI = Q_k/P_k * N_k/M_k * F_{refj}$.

2. The method recited in claim 1, wherein step (c) comprises a calculation based on a form of Euclid's algorithm.

3. The method recited in claim 2 where step (i) further comprises replacing said $M_i, N_i, P_i$ and $Q_i$ values by values $s*M_i, s*N_i, v*P_i$ and $v*Q_i$ respectively, whereby both $s*M_i, s*N_i, v*P_i$ and $v*Q_i$ are larger respectively than $M_i, N_i, P_i$ and $Q_i$, but still less than $M_{max}, N_{max}, P_{max}$ and $Q_{max}$ respectively.

4. The method recited in claim 3, wherein said adjustable reference means comprises more than one stable reference oscillator, oscillating at more than one stable frequency, and a selector means operatively connected to each of said stable oscillators, and wherein:
  step (b) comprises selecting one among said plurality of reference frequencies, and;
  step (i) comprises commanding said selector means to select the corresponding signal from said selected oscillator.

5. The method recited in claim 4 wherein one of said stable reference oscillators is adapted to oscillate at a standard frequency, and wherein:
  step (b) comprises selecting said standard frequency reference frequency as a first choice, and other of said frequencies as subsequent choices if required by step (i).

6. The method recited in claim 3, wherein said adjustable reference means is a single oscillator, with a variable frequency control, and wherein:
  step (b) comprises selecting a $F_{refj}$ value within the range of said variable frequency control, and;
  step (i) comprises commanding said variable frequency control to cause said adjustable reference means to produce said frequency $F_{refj}$.

7. The method recited in claim 3 wherein said adjustable reference means comprises a third PLL including a fixed reference source of a known type, of frequency $F_t$; a fifth programmable divider dividing said signal $F_t$ by an integer M', and producing divided signal $F_t/M'$; a third adjustable oscillator of output frequency $F_{refj}$; a sixth programmable divider dividing said output signal $F_{refj}$ by a second integer N', and producing second divided signal $F_{refj}/N'$; and a comparison means to compare said divided signals $F_t/M'$ and $F_{refj}/N'$ and produce a third control signal responsive to the difference therebetween, and therewith to control said third adjustable oscillator to minimize said difference and cause said loop to lock; and a memory means containing at least two pair of precalculated values $M_j'$ and $N_j'$, a control means to load said pairs into said programmable dividers, and wherein:
  step (b) recited in claim 3 consists of selecting one of said pairs of $M_j'$ and $N_j'$;
  step (i) recited in claim 3 consists of causing said control means to load said $M_j'$ and $N_j'$ values into said fifth and sixth programmable dividers, and whereby after lock of said third PLL, the reference frequency $F_{refj}$ stands to said fixed reference $F_t$ in the relation described by the equation: $F_{refj} = (N_j'/M_j') * F_t$.

8. The method recited in claim 7 wherein said fixed reference source $F_t$ is adapted to oscillate at a multiple of a standard frequency, and where said fixed reference source further comprises means to allow an "external time base input" and "internal time base output" feature.

9. The method recited in claim 8 where said second oscillator has a narrow range of output frequencies, offset from and avoiding any simple multiple of said fixed reference $F_t$, and wherein step (b) further comprises choosing among a collection of pairs $M_j', N_j'$ wherein the values of said pairs are restricted whereby their ratios fall within said narrow offset range.

10. In a frequency synthesizer of a type employing a reference means, and a first PLL with an input locked thereto, and a second PLL with an input locked to the output of said first PLL, and a calculation and control means operatively connected to said PLL's, a method for generating an output signal $F_{out}$ from said second PLL, having a stable, adjustable frequency, which is a close approximation to a requested frequency $F_{req}$, said method comprising the steps of:

(a) receiving a request for an output frequency $F_{req}$;

(b) providing a reference signal $F_{ref}$;

(c) generating an intermediate frequency signal (FI) in an intermediate oscillator in said first PLL, said intermediate oscillator responsive to a first control signal, and said intermediate oscillator having a frequency range described by $F_{imin} < F_i < F_{imax}$;

(d) generating an output frequency signal ($F_{out}$) in an output oscillator in said second PLL, said output oscillator responsive to a second control signal;

(e) calculating a plurality of integer pairs $P_i, Q_i$ that, taken as a ratio $P_i/Q_i$, are approximations to the ratio $(M_g*F_{req})/(N_g*F_{ref})$, where $M_g, N_g$ is an integer pair, chosen from among at least one set of integer pairs, and where said pre-selected integer pair satisfies: $F_{imin} < (N_g/M_g)*F_{ref} < F_{imax}$;

(f) selecting a pair $P_k, Q_k$, from among said plurality of calculated integer pairs, with the largest value of $Q_k$ wherein said $Q_k$ does not exceed a pre-specified maximum value $Q_{max}$, and wherein $P_k$ does not exceed a pre-specified maximum value $P_{max}$;

(g) sending said integer $P_k$ to a third programmable divider responsive to said intermediate signal FI, wherewith to program its divide value, and sending said integer $Q_k$ to a fourth programmable divider responsive to said output signal $F_{out}$, wherewith to program its divide value;

(h) dividing said intermediate signal FI by said integer $P_k$ in said third programmable divider, to produce a divided output $(FI/P_k)$, and dividing said output signal $F_{out}$ by said integer $Q_k$ in said fourth programmable divider, to produce a second divided output $(F_{out}/Q_k)$;

(i) comparing said two divided signals in a second comparison means, to produce a second control signal that is responsive to the difference between $FI/P_k$ and $F_{out}/Q_k$;

(j) controlling said output oscillator by means of said second control signal to cause said second PLL to lock, and whereupon: $F_{out} = (Q_k/P_k)*FI$;

(k) calculating a second plurality of integer pairs $M_i, N_i$ that, taken as a ratio $M_i/N_i$, are approximations to the ratio $(F_{req}*Q_k)/(F_{ref}*P_k)$, wherein $Q_k$ and $P_k$ are the integers selected in step (f);

(l) selecting a pair $M_k, N_k$, from among said second plurality of pairs, with the largest value of $N_k$ wherein said $N_k$ does not exceed a pre-specified maximum value $N_{max}$, and wherein $M_k$ does not exceed a pre-specified maximum value $M_{max}$;

(m) sending said integer $M_k$ to a first programmable counter responsive to said reference signal $F_{ref}$, wherewith to program its divide value, and sending said integer $N_k$ to a second programmable counter responsive to said intermediate signal FI wherewith to program its divide value;

(n) dividing said reference signal $F_{ref}$ by said integer $M_k$ in said first programmable divider, to produce a divided output $(F_{ref}/M_k)$, and dividing said intermediate signal FI by said second integer $N_k$ in said second programmable divider, to produce a second divided output $(FI/N_k)$;

(o) comparing said two divided signals in a comparison means, to produce a first control signal that is responsive to the difference between $F_{ref}/M_k$ and $FI/N_k$;

(p) controlling said intermediate oscillator by means of said first control signal to cause said first PLL to lock, whereupon $FI = (N_k/M_k)*F_{ref}$, and whereby the relation of output frequency $F_{out}$ to the reference frequency $F_{ref}$, is described by the equation $F_{out} = (Q_k/P_k)*(N_k/M_k)*F_{ref}$.

11. A method as recited in claim 10, where step (e) and step (k) use a form of Euclids Algorithm.

12. The method recited in claim 11 where step (f) further comprises replacing said $M_i, N_i, P_i$ and $Q_i$ values by values $s*M_i, s*N_i, v*P_i$ and $v*Q_i$ respectively, whereby both $s*M_i, s*N_i, v*P_i$ and $v*Q_i$ are larger respectively than $M_i, N_i, P_i$ and $Q_i$, but still less than $M_{max}, N_{max}, P_{max}$ and $Q_{max}$ respectively.

13. The method recited in claim 12 wherein said reference source $F_t$ is adapted to oscillate at a standard frequency, and where said fixed reference source further comprises means to allow an "external time base input" and "internal time base output" feature.

14. A method as recited in claim 12, where said reference means is an adjustable reference means, and said method further comprises the steps of:

(x) selecting a numerical value $F_{refj}$, said value within the frequency range of said adjustable reference means, said selection occuring before step (b) of said claim 12, and;

(y) calculating a value responsive to the equation $err = F_{req} - ((Q_k/P_k)* (N_k/M_k)*F_{refj})$, said calculation occuring after step (l) of said claim 12, and;

(z) comparing said value to a pre-selected limit value, and upon the condition that said calculated value is larger than said limit value, selecting a new value of $F_{refj}$, and repeating steps (x) through (z) of the present claim, including the corresponding steps of claim 12; and upon the condition that said calculated value is smaller than said limit value, proceeding to steps (g),(h),(i),(j) and (m),(n),(o), and (p) of claim 12.

15. In a frequency synthesizer of a type employing a reference means, and a first PLL with an input locked thereto, and a second PLL with an input locked to the output of said first PLL, and a calculation and control means operatively connected to said PLL's, a method for generating an output signal $F_{out}$ from said second PLL, having a stable, adjustable frequency, which is close approximation to a requested frequency $F_{req}$, said method comprising the steps of:

(a) receiving a request for an output frequency $F_{req}$;

(b) providing a reference signal $F_{ref}$;

(c) generating an intermediate frequency signal (FI) in an intermediate oscillator in said first PLL, said intermediate oscillator responsive to a first control signal, and said intermediate oscillator having a frequency range described by $FI_{min} < FI < FI_{max}$;

(d) generating an output frequency signal ($F_{out}$) in an output oscillator in said second PLL, said output oscillator responsive to a second control signal;

(e) selecting a pair of integers $M_g, N_g$, from among at least two sets of pre-selected integer pairs, where said pre-selected integer pairs each satisfy: $FI_{min} < (N_g/M_g)*F_{ref} < FI_{max}$;

(f) calculating a plurality of integer pairs $P_i, Q_i$ that, taken as a ratio $P_i/Q_i$, are approximations to the ratio $(M_g*F_{req})/(N_g*F_{ref})$;

(g) selecting a pair $P_k, Q_k$, from among said plurality of pre-selected integer pairs, with the largest value of $Q_k$ wherein said $Q_k$ does not exceed a pre-specified maximum value $Q_{max}$, and wherein said $P_k$ does not exceed a pre-specified maximum value $P_{max}$;

(h) calculating a second plurality of integer pairs $M_i, N_i$ that, taken as a ratio $M_i/N_i$, are approximations to the ratio $(F_{req}*Q_k)/(F_{ref}*P_k)$, wherein $Q_k$ and $P_k$ are the integers selected in step (g);

(i) selecting a pair $M_k, N_k$, from among said second plurality of pairs, with the largest value of $N_k$ wherein said $N_k$ does not exceed a pre-specified maximum value $N_{max}$, and wherein said $M_k$ does not exceed a pre-specified maximum value $M_{max}$;

(j) calculating a value, responsive to the equation: $err = F_{req} - F_{out} = F_{req} - (N_k/M_k)*(Q_k/P_k)*F_{ref}$;

(k) comparing said calculated value to a pre-selected limit value, and upon the condition that said calculated value is larger than said limit value, selecting a new value of $F_{ref}$ and repeating steps (e) through (k); and upon the condition that said calculated value is smaller than said limit value, proceeding to step (l);

(l) sending said integer $P_k$ to a third programmable divider responsive to said intermediate signal FI, wherewith to program its divide value, and sending said integer $Q_k$ to a fourth programmable divider responsive to said output signal $F_{out}$, wherewith to program its divide value;

(m) dividing said intermediate signal FI by said integer $P_k$ in said third programmable divider, to produce a divided output $(FI/P_k)$, and dividing said output signal $F_{out}$ by said integer $Q_k$ in said fourth programmable divider, to produce a second divided output $(F_{out}/Q_k)$;

(n) comparing said two divided signals in a second comparison means, to produce a second control signal that is responsive to the difference between $FI/P_k$ and $F_{out}/Q_k$;

(o) controlling said output oscillator by means of said second control signal to cause said second PLL to lock, and whereupon: $F_{out} = (Q_k/P_k)*FI$;

(p) sending said integer $M_k$ to a first programmable counter responsive to said reference signal $F_{ref}$, wherewith to program its divide value, and sending said integer $N_k$ to a second programmable counter responsive to said intermediate signal FI wherewith to program its divide value;

(q) dividing said reference signal $F_{ref}$ by said integer $M_k$ in said first programmable divider, to produce a divided output $(F_{ref}/M_k)$, and dividing said intermediate signal FI by said second integer $N_k$ in said second programmable divider, to produce a second divided output $(FI/N_k)$;

(r) comparing said two divided signals in a comparison means, to produce a first control signal that is responsive to the difference between $F_{ref}/M_k$ and $FI/N_k$;

(s) controlling said intermediate oscillator by means of said first control signal to cause said first PLL to lock, whereupon $FI = (N_k/M_k)*F_{ref}$, and whereby the relation of output frequency $F_{out}$ to the reference frequency $F_{ref}$ is described by the equation $F_{out} = (Q_k/P_k)*(N_k/M_k)*F_{ref}$.

16. A method as recited in claim 15, where step (f) and step (h) use a form of Euclids Algorithm.

17. The method recited in claim 16 where step (l) further comprises replacing said $M_i$, $N_i$, $P_i$ and $Q_i$ values by values $s*M_i$, $s*N_i$, $v*P_i$ and $v*Q_i$ respectively, whereby both $s*M_i$, $s*N_i$, $v*P_i$ and $v*Q_i$ are larger respectively than $M_i$, $N_i$, $P_i$ and $Q_i$, but still less than $M_{max}$, $N_{max}$, $P_{max}$ and $Q_{max}$ respectively.

18. The method recited in claim 17 wherein said reference source $F_t$ is adapted to oscillate at a standard frequency, and where said fixed reference source further comprises means to allow an "external time base input" and "internal time base output" feature.

* * * * *